United States Patent
Yang et al.

(10) Patent No.: US 10,756,137 B2
(45) Date of Patent: Aug. 25, 2020

(54) MTJ PATTERNING WITHOUT ETCH INDUCED DEVICE DEGRADATION ASSISTED BY HARD MASK TRIMMING

(71) Applicant: Headway Technologies, Inc., Milpitas, CA (US)

(72) Inventors: Yi Yang, Fremont, CA (US); Dongna Shen, San Jose, CA (US); Yu-Jen Wang, San Jose, CA (US)

(73) Assignee: Headway Technologies, Inc., Milpitas, CA (US)

( * ) Notice: Subject to any disclaimer, the term of this patent is extended or adjusted under 35 U.S.C. 154(b) by 0 days.

(21) Appl. No.: 16/215,094

(22) Filed: Dec. 10, 2018

(65) Prior Publication Data

US 2020/0185454 A1 Jun. 11, 2020

(51) Int. Cl.
| | |
|---|---|
| *H01L 27/22* | (2006.01) |
| *H01L 43/02* | (2006.01) |
| *H01L 43/12* | (2006.01) |
| *H01L 43/10* | (2006.01) |
| *H01L 43/08* | (2006.01) |

(52) U.S. Cl.
CPC .......... *H01L 27/222* (2013.01); *H01L 43/02* (2013.01); *H01L 43/08* (2013.01); *H01L 43/10* (2013.01); *H01L 43/12* (2013.01)

(58) Field of Classification Search
CPC ..... H01L 27/222; H01L 27/228; H01L 43/08; H01L 43/10; H01L 43/12
See application file for complete search history.

(56) References Cited

U.S. PATENT DOCUMENTS

| | | | |
|---|---|---|---|
| 7,642,572 B2 | 1/2010 | Popp et al. | |
| 9,087,981 B2 | 7/2015 | Hsu et al. | |
| 9,406,876 B2 | 8/2016 | Pinarbasi | |
| 10,388,862 B1 * | 8/2019 | Yang | H01L 27/222 |
| 2017/0256708 A1 | 9/2017 | Krounbi et al. | |
| 2019/0363249 A1 * | 11/2019 | Yang | H01F 41/34 |

* cited by examiner

*Primary Examiner* — Hsien Ming Lee
(74) *Attorney, Agent, or Firm* — Saile Ackerman LLC; Stephen B. Ackerman; Rosemary L. S. Pike

(57) ABSTRACT

A MTJ stack comprising at least a pinned layer, a barrier layer, and a free layer is deposited on a bottom electrode. A top electrode layer, a carbon-based hard mask, and a dielectric hard mask are deposited in order on the MTJ stack. First, the hard masks and MTJ stack are etched. The etched MTJ stack has a first width. During the first etching, chemical damage forms on sidewalls of the MTJ stack. Next, the carbon-based hard mask is trimmed to a second width smaller than the first width. Then in a second etching, the top electrode and free layer of said MTJ stack not covered by the trimmed carbon-based hard mask are etched to complete formation of the MTJ structure wherein during the second etching of the free layer, chemical damage is removed from the free layer and metal re-deposition is formed on sidewalls of the free layer.

20 Claims, 2 Drawing Sheets

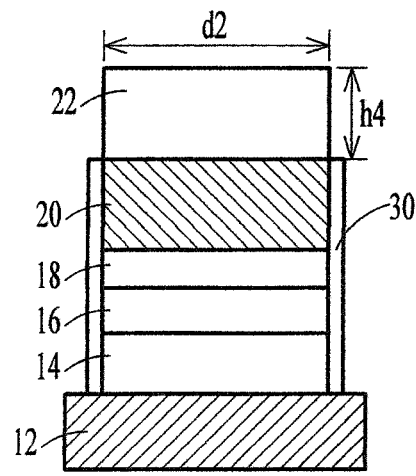
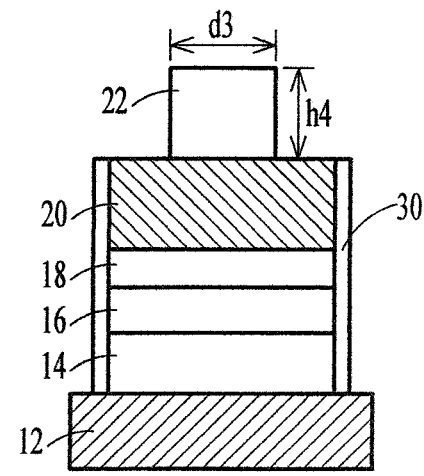
Figure 5               Figure 6
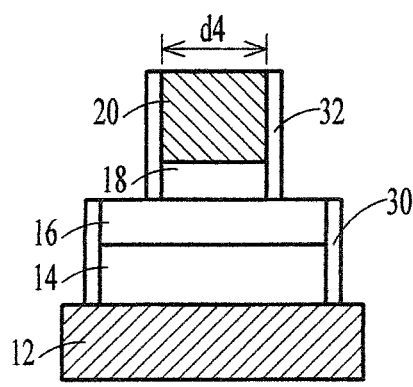
Figure 7

US 10,756,137 B2

MTJ PATTERNING WITHOUT ETCH INDUCED DEVICE DEGRADATION ASSISTED BY HARD MASK TRIMMING

TECHNICAL FIELD

This application relates to the general field of magnetic tunneling junctions (MTJ) and, more particularly, to methods for preventing shorts and sidewall damage in the fabrication of MTJ structures.

BACKGROUND

Fabrication of magnetoresistive random-access memory (MRAM) devices normally involves a sequence of processing steps during which many layers of metals and dielectrics are deposited and then patterned to form a magnetoresistive stack as well as electrodes for electrical connections. To define the magnetic tunnel junctions (MTJ) in each MRAM device, precise patterning steps including photolithography and reactive ion etching (RIE), ion beam etching (IBE) or their combination are usually involved. During RIE, high energy ions remove materials vertically in those areas not masked by photoresist, separating one MTJ cell from another. However, the high energy ions can also react with the non-removed materials, oxygen, moisture and other chemicals laterally, causing sidewall damage and lowering device performance.

To solve this issue, pure physical etching techniques such as pure Ar RIE or ion beam etching (IBE) have been applied to etch the MTJ stack. However, due to the non-volatile nature, physically etched conductive materials in the MTJ and bottom electrode can form a continuous path across the tunnel barrier, resulting in shorted devices. A promising approach to overcome this dilemma is to firstly partially etch the MTJ by physical RIE or IBE so that there is no chemical damage on the MTJ's free layer and the metal re-deposition is minimized. Secondly, either using additional photolithography or a self-aligned spacer hard mask, the remaining MTJ is etched by a chemical etch. In either case, the later etched MTJ portion has to be larger than the earlier etched portion so that the chemical damage on the MTJ's bottom portion does not affect the device performance, because its central effective portion, which is aligned with the free layer, is not chemically damaged. However, these additional complex photolithography or spacer deposition and etch steps result in a much higher fabrication cost. A simpler approach allowing for the same device structure and etch schemes is therefore needed.

Several patents teach two-step methods of etching MTJ stacks using spacers, including U.S. Pat. No. 9,087,981 (Hsu et al) and U.S. Pat. No. 9,406,876 (Pinarasi). Other patents disclose carbon hard masks, including U.S. Pat. No. 7,642,572 (Popp et al) and U.S. Patent Application 2017/0256708 (Krounbi et al), but these methods are different from the present disclosure.

SUMMARY

It is a primary object of the present disclosure to provide a method of forming MTJ structures without chemical damage on the free layer or shorting of MTJ devices.

Another object of the present disclosure is to provide a method of forming MTJ structures having no chemical damage on the free layer sidewalls and eliminating conductive metal re-deposition induced shorted devices.

Another object of the present disclosure is to provide a method of forming MTJ structures having no chemical damage on the free layer sidewalls by first etching the MTJ stack wherein there is chemical damage on the sidewalls and then etching the free layer to remove chemical damage on the free layer sidewalls wherein metal re-deposition from this etching will not cause shorted devices.

In accordance with the objectives of the present disclosure, a method for fabricating a magnetic tunneling junction (MTJ) structure is achieved. A MTJ stack is deposited on a bottom electrode wherein the MTJ stack comprises at least a pinned layer, a barrier layer on the pinned layer, and a free layer on the barrier layer. A top electrode layer is deposited on the MTJ stack. A carbon-based hard mask is deposited on the top electrode layer. A dielectric hard mask is deposited on the carbon-based hard mask. First, the dielectric hard mask, carbon-based hard mask, top electrode layer, and MTJ stack not covered by a photoresist pattern are etched wherein more than one third of a thickness of the carbon-based hard mask remains. The etched MTJ stack has a first width. During the first etching, chemical damage forms on sidewalls of the MTJ stack. Next, the carbon-based hard mask is trimmed to a second width smaller than the first width. Then in a second etching, the top electrode and free layer of said MTJ stack not covered by the trimmed carbon-based hard mask are etched to complete formation of the MTJ structure wherein during the second etching of the free layer, chemical damage is removed from the free layer and metal re-deposition is formed on sidewalls of the free layer.

Also in accordance with the objectives of the present disclosure, a magnetic tunneling junction (MTJ) structure comprises a pinned layer on a bottom electrode and a barrier layer on the pinned layer wherein the pinned layer and barrier layer have a first width, a free layer on the barrier layer and a top electrode on the free layer wherein the free layer and top electrode layer have a second width smaller than the first width. Sidewalls of the barrier layer and pinned layer are chemically damaged and a metal re-deposition layer is on sidewalls of the free layer and top electrode, but not on sidewalls of the barrier layer and pinned layer; therefore there is no electrical shorting.

BRIEF DESCRIPTION OF THE DRAWINGS

In the accompanying drawings forming a material part of this description, there is shown:

FIGS. 1 through 7 illustrate in cross-sectional representation steps in a preferred embodiment of the present disclosure.

DETAILED DESCRIPTION

In a typical fabrication process, the whole MTJ stack is patterned by a single etch step, either by chemical RIE or physical Ar RIE or IBE. This etch creates either chemical damage or physical shorts on the MTJ sidewalls. In the present disclosure, we separate the MTJ etch into two steps, with a hard mask trimming in between, so that the chemical damage or physical shorts can no longer affect the device performance.

In the present disclosure, using a very thick hard mask, the MTJ stack is first completely etched by a chemical RIE so that there is no metal re-deposition but only a thin layer of chemical damage on the sidewall. Then, with a trimming step, the remaining hard mask shrinks. Next, using the smaller hard mask, the MTJ is partially etched by physical RIE or IBE, stopping on the barrier without any metal re-deposition on the sidewalls of the barrier, pinned layer or bottom electrode underneath. The concept of utilizing hard mask trimming to form stepped MTJ patterns is the novel feature of this disclosure.

Figure 1:
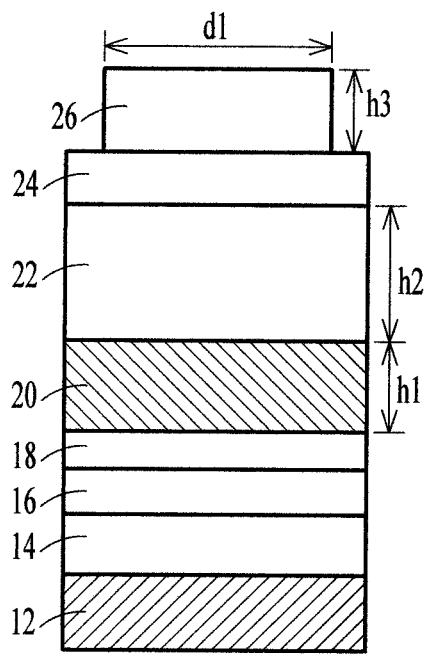

The preferred embodiment of the present disclosure will be described in more detail with reference to FIGS. 1-7. FIG. 1 illustrates a bottom electrode layer 12 formed on a semiconductor substrate, not shown. Now, the MTJ stack, comprising at least a pinned layer 14, a tunnel barrier layer 16, and a free layer 18, is deposited on the bottom electrode. A top electrode 20 comprising Ta, TaN, Ti, TiN, W, Cu, Mg, Ru, Cr, Co, Fe, Ni or their alloys is deposited over the MTJ stack to a thickness h1 of 10-100 nm, and preferably ≥50 nm. An ultra-thick hard mask 22, preferably carbon-based, is deposited on the top electrode by spin-coating or chemical vapor deposition (CVD) to a thickness h2 of ≥500 nm. The carbon-based hard mask may be fullerene or amorphous carbon, for example. A dielectric hard mask 24 of $SiO_2$, SiN, SiON, SiC or SiCN is deposited onto the carbon hard mask to a thickness of ≥20 nm. Finally a photoresist mask 26 is formed over the hard mask 22 forming pillar patterns with size d1 of approximately 80-100 nm and height h3 of ≥200 nm.

Figure 2:
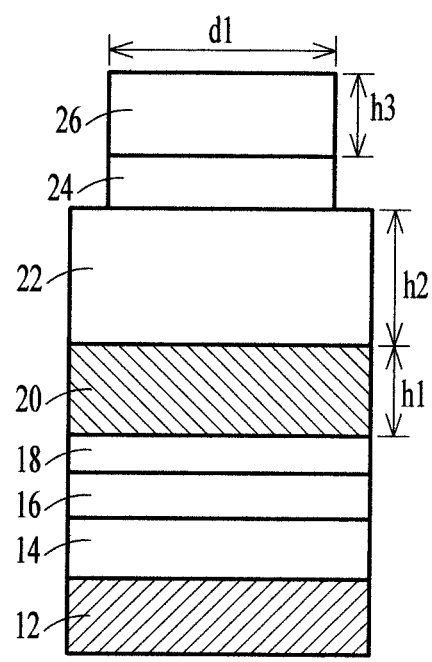
Figure 3:
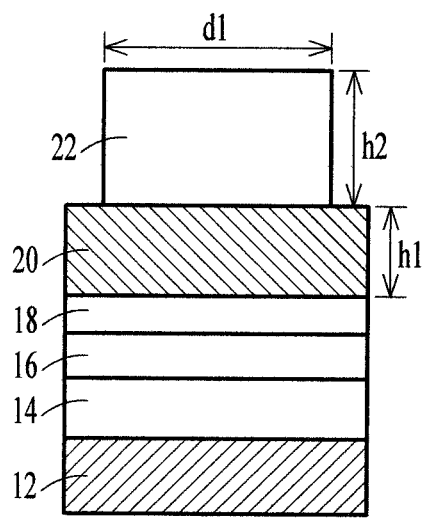

Now, as shown in FIG. 2, the dielectric hard mask 22 is etched by a fluorine carbon based plasma such as $CF_4$ or $CHF_3$ alone, or mixed with Ar and $N_2$. During the next step, as illustrated in FIG. 3, $O_2$ is mixed with a halogen such as $Cl_2$ and HBr plasma with a low source power <400 W and a high bias power >100 W to anisotropically etch the carbon hard mask. This $O_2$ based plasma has a very low etch rate on the hard mask above and underneath, allowing the formation of carbon hard mask patterns with an ultra-large height of >500 nm and great pattern quality. The photoresist mask and the dielectric hard mask are totally consumed by these etch steps.

Figure 4:
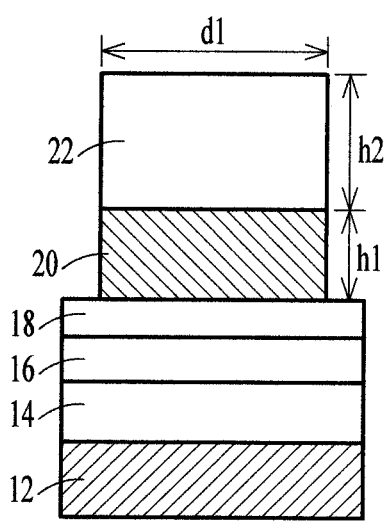

Next, as shown in FIG. 4, the top electrode is etched by a fluorine carbon based plasma such as $CF_4$ or $CHF_3$ alone, or mixed with Ar and $N_2$. Next, as illustrated in FIG. 5, the MTJ is completely etched by a chemical RIE with gas species such as $CH_3OH$ alone or mixed with Ar and $O_2$, forming a pattern size d2 of ~70-90 nm. Due to the nature of this type of etch, a thin layer of chemical damage 30 is formed on the whole pattern's sidewall. Since the initial carbon hard mask is thick, the remaining carbon hard mask still has a height h4 of >200 nm after the MTJ etch. That is, the height of the remaining carbon hard mask is at least ⅓ of the original thickness.

Referring now to FIG. 6, the remaining carbon hard mask 22 is trimmed by $O_2$ mixed with a halogen such as HBr or $Cl_2$ plasma. During this step a high source power ranging from 400-1000 W and low bias power ranging from 0-100 W are used, so that the carbon hard mask only shrinks horizontally but not vertically.

Now, as shown in FIG. 7, using the trimmed carbon hard mask 22 as a pattern, the top electrode or metal hard mask 20 is etched by a fluorine carbon based plasma such as $CF_4$ or $CHF_3$ alone, or mixed with Ar and $N_2$. The metal hard mask can also be etched by a physical RIE or IBE. The MTJ is then partially etched using physical RIE or IBE, stopping on the barrier layer 16. At this step, there is no chemical damage but only a thin layer of metal re-deposition 32. Here it should be noted that this re-deposition usually grows upward, only covering the sidewalls of the free layer 18 and top electrode 20 above, not the barrier, pinned layer or bottom electrode underneath, therefore not resulting in electrically shorted devices. Moreover, since the pinned layer is 70-90 nm (d2), larger than the free layer size d4 of ~20-30 nm, the chemical damage on the pinned layer's sidewall does not affect its central portion which is aligned with the free layer above. Thus, the chemical damage 30 does not degrade the device performance.

It should be noted that the process of the present disclosure only needs one step of photolithography. The MTJ hard mask and stack are etched, trimmed, and etched again by different gas plasmas in the same tool to form the stepped patterns. No additional photolithography or spacer deposition and etch steps are needed. This process is a low cost approach because it does not require additional expensive and complex photolithography or self-aligned spacer deposition and etch steps.

In the process of the present disclosure, we separate the MTJ etch into two steps, with a hard mask trimming in between, so that any chemical damage or physical shorts cannot affect the device performance. More importantly, it does not require additional photolithography or self-aligned spacer deposition and etch steps, offering a much simpler and lower cost solution. This process is especially useful for MRAM chips of size smaller than 60 nm as problems associated with chemically damaged sidewalls and re-deposition from the bottom electrode become very severe for these smaller sized MRAM chips.

Although the preferred embodiment of the present disclosure has been illustrated, and that form has been described in detail, it will be readily understood by those skilled in the art that various modifications may be made therein without departing from the spirit of the disclosure or from the scope of the appended claims.

What is claimed is:

1. A method for fabricating a magnetic tunneling junction (MTJ) structure comprising:
   depositing a MTJ stack on a bottom electrode wherein said MTJ stack comprises at least a pinned layer, a barrier layer on said pinned layer, and a free layer on said barrier layer;
   depositing a top electrode layer on said MTJ stack;
   depositing a hard mask on said top electrode layer;
   depositing a dielectric hard mask on said hard mask;
   first etching said dielectric hard mask, said hard mask, said top electrode layer, and said MTJ stack using a photoresist pattern as a first etching mask wherein after said first etching, said photoresist pattern mask and said dielectric hard mask are removed, more than one third of a thickness of said hard mask remains, and an etched said MTJ stack has a first width;
   thereafter horizontally trimming said hard mask to a second width smaller than said first width;
   thereafter second etching both said top electrode and said free layer of said etched MTJ stack using trimmed said hard mask as a second etching mask to complete formation of said MTJ structure wherein said pinned layer and said barrier layer have said first width and said top electrode and said free layer of said MTJ structure have said second width.

2. The method according to claim 1 wherein said top electrode layer comprises Ta, TaN, Ti, TiN, W, Cu, Mg, Ru, Cr, Co, Fe, Ni or their alloys having a thickness of 10-100 nm.

3. The method according to claim 1 wherein said hard mask comprises a carbon base, having a thickness of ≥500 nm.

4. The method according to claim 1 wherein said dielectric hard mask comprises $SiO_2$, SiN, SiON, SiC or SiCN having a thickness of ≥20 nm.

5. The method according to claim 1 wherein said first etching comprises a chemical RIE with gas species comprising $CH_3OH$ alone or mixed with Ar and $O_2$.

6. The method according to claim 5 further comprising:
etching said dielectric hard mask using a fluorine carbon based plasma comprising $CF_4$ or $CHF_3$ alone, or mixed with Ar and $N_2$;
thereafter etching said hard mask using $O_2$ mixed with a $Cl_2$ and HBr plasma with a source power <400 W and a bias power >100 W;
thereafter etching said top electrode using a carbon-based plasma alone, or mixed with Ar and $N_2$ or a physical RIE or IBE; and
thereafter performing said first etching to etch said MTJ stack.

7. The method according to claim 1 wherein said trimming comprises etching said hard mask layer with $O_2$ mixed with HBr or $Cl_2$ plasma at a source power of 400 to 1000 W and bias power of 0 to 100 W.

8. The method according to claim 1 wherein said second etching comprises a pure Ar RIE or IBE etching.

9. The method according to claim 8 after said trimming and prior to said second etching, further comprising:
etching said top electrode using a fluorine carbon based plasma such as $CF_4$ or $CHF_3$ alone, or mixed with Ar and $N_2$.

10. The method according to claim 1 wherein during said first etching, forming chemical damage forms on sidewalls of said MTJ stack, wherein during said second etching of said free layer, removing said chemical damage from said free layer and forming a metal re-deposition layer on sidewalls of said free layer and wherein since said free layer has a second width smaller than said first width of said barrier and pinned layers, said chemical damage does not affect a central portion of said barrier and pinned layers underlying said free layer and said metal re-deposition layer does not contact said bottom electrode; therefore, there is no electrical shorting.

11. The method according to claim 1 wherein said first width is 70-90 nm and said second width is 20-30 nm.

12. A method for fabricating a magnetic tunneling junction (MTJ) structure comprising:
depositing a MTJ stack on a bottom electrode wherein said MTJ stack comprises at least a pinned layer, a barrier layer on said pinned layer, and a free layer on said barrier layer;
depositing a top electrode layer on said MTJ stack;
depositing a carbon-based hard mask on said top electrode layer;
depositing a dielectric hard mask on said carbon-based hard mask;
forming a photoresist mask on said dielectric hard mask;
first etching said dielectric hard mask, said carbon-based hard mask, said top electrode layer, and said MTJ stack using said photoresist mask as a first etching mask wherein said photoresist mask and said dietric hard mask are consumed by said first etching, more than one third of a thickness of said carbon-based hard mask remains after said first etching, and an etched said MTJ stack has a first width and wherein during said first etching, forming chemical damage on sidewalls of said etched MTJ stack;
thereafter horizontally trimming said carbon-based hard mask to a second width smaller than said first width;
thereafter second etching said top electrode and said free layer of said etched MTJ stack using trimmed said carbon-based hard mask as a second etching mask to complete formation of said MTJ structure wherein during said second etching of said free layer, removing said chemical damage from said free layer and forming metal re-deposition on sidewalls of said free layer wherein said pinned layer and said barrier layer have said first width and said top electrode and said free layer of said MTJ structure have said second width.

13. The method according to claim 12 wherein said first etching comprises:
etching said dielectric hard mask using a fluorine carbon based plasma comprising $CF_4$ or $CHF_3$ alone, or mixed with Ar and $N_2$;
thereafter etching said carbon-based hard mask using $O_2$ mixed with a $Cl_2$ and HBr plasma with a source power <400 W and a bias power >100 W;
thereafter etching said top electrode using a carbon-based plasma alone, or mixed with Ar and $N_2$ or a physical RIE or IBE; and
thereafter etching said MTJ stack using a chemical RIE with gas species comprising $CH_3OH$ alone or mixed with Ar and $O_2$.

14. The method according to claim 12 wherein said trimming comprises etching said carbon-based hard mask layer with $O_2$ mixed with HBr or $Cl_2$ plasma at a source power of 400 to 1000 W and bias power of 0 to 100 W.

15. The method according to claim 12 wherein said second etching comprises:
etching said top electrode using a fluorine carbon based plasma such as $CF_4$ or $CHF_3$ alone, or mixed with Ar and $N_2$; and
thereafter etching said free layer using pure Ar RIE or IBE etching.

16. The method according to claim 12 wherein since said free layer has said second width smaller than said first width of said barrier and pinned layers, said chemical damage does not affect a central portion of said barrier and pinned layers underlying said free layer and said metal re-deposition does not contact said bottom electrode; therefore, there is no electrical shorting.

17. The method according to claim 1 wherein said first width is 70-90 nm and said second width is 20-30 nm.

18. A magnetic tunneling junction (MTJ) comprising:
a pinned layer on a bottom electrode;
a barrier layer on said pinned layer wherein said barrier layer and said pinned layer have a first width;
a free layer on said barrier layer; and
a top electrode on said free layer wherein said free layer and said top electrode have a second width smaller than said first width.

19. The MTJ according to claim 18 wherein said first width is 20-30 nm and said second width is 70-90 nm.

20. The MTJ according to claim 18 wherein sidewalls of said barrier layer and said pinned layer are chemically damaged and wherein a metal re-deposition layer is on sidewalls of said free layer and said top electrode, but not on sidewalls of said barrier layer and said pinned layer; therefore there is no electrical shorting.

* * * * *